(12) United States Patent
Emanuelsson et al.

(10) Patent No.: US 11,936,111 B2
(45) Date of Patent: Mar. 19, 2024

(54) ANTENNA ARRAY BASED ON ONE OR MORE METAMATERIAL STRUCTURES

(71) Applicant: GAPWAVES AB, Gothenburg (SE)

(72) Inventors: Thomas Emanuelsson, Västra Frölunda (SE); Yang Jian, Mölndal (SE); Ashraf Uz Zaman, Hisings Backa (SE); Wai Yan Yong, Enschede (NL)

(73) Assignee: GAPWAVES AB, Gothenburg (SE)

( * ) Notice: Subject to any disclaimer, the term of this patent is extended or adjusted under 35 U.S.C. 154(b) by 332 days.

(21) Appl. No.: 17/426,237

(22) PCT Filed: Feb. 4, 2020

(86) PCT No.: PCT/SE2020/050103
§ 371 (c)(1),
(2) Date: Jul. 28, 2021

(87) PCT Pub. No.: WO2020/162818
PCT Pub. Date: Aug. 13, 2020

(65) Prior Publication Data
US 2022/0109246 A1    Apr. 7, 2022

(30) Foreign Application Priority Data

Feb. 8, 2019 (SE) .................................... 1930047-4

(51) Int. Cl.
*H01Q 21/00* (2006.01)
*H01P 3/123* (2006.01)
(Continued)

(52) U.S. Cl.
CPC ......... *H01Q 21/0037* (2013.01); *H01P 3/123* (2013.01); *H01Q 21/062* (2013.01);
(Continued)

(58) Field of Classification Search
CPC ............. H01Q 21/0037; H01Q 21/062; H01Q 21/065; H01Q 1/523; H01Q 1/526;
(Continued)

(56) References Cited

U.S. PATENT DOCUMENTS 8,803,638 B2    8/2014 Kildal
2010/0073232 A1    3/2010 Sajuyigbe
(Continued)

FOREIGN PATENT DOCUMENTS

| EP | 3166205 | 5/2017 |
|---|---|---|
| WO | 2015161323 | 10/2015 |
| WO | 2015172948 | 11/2015 |

OTHER PUBLICATIONS

International Search Report issued in PCT/SE2020/050103, dated Mar. 20, 2020, pp. 1-3.
(Continued)

*Primary Examiner* — Jean B Jeanglaude
(74) *Attorney, Agent, or Firm* — Jeffrey S. Melcher; Melcher Patent Law PLLC

(57) ABSTRACT

An antenna array with a layered structure having a base layer with a metamaterial structure, a printed circuit board (PCB) layers, a feed layer arranged on the opposite side of the PCB from the RF IC(s), and a radiating layer arranged on the feed layer. The radiating layer having a plurality of radiating elements. The metamaterial structure is arranged to attenuate electromagnetic radiation propagating between the at least two adjacent waveguides in the frequency band.

16 Claims, 8 Drawing Sheets

(51) Int. Cl.
*H01Q 21/06* (2006.01)
*H05K 1/02* (2006.01)

(52) U.S. Cl.
CPC ......... *H01Q 21/065* (2013.01); *H05K 1/0243* (2013.01); *H05K 2201/10098* (2013.01)

(58) Field of Classification Search
CPC .. H01Q 9/28; H01Q 15/0073; H01Q 21/0006; H01Q 21/064; H01Q 3/24; H01P 3/123; H01P 1/2005; H01P 3/00; H05K 1/0243; H05K 2201/10098
USPC .......................................................... 343/816
See application file for complete search history.

(56) References Cited

U.S. PATENT DOCUMENTS

| | | | |
|---|---|---|---|
| 2011/0181373 A1* | 7/2011 | Kildal | H01P 1/2005 333/239 |
| 2015/0222014 A1* | 8/2015 | Stevenson | H01Q 13/18 342/372 |
| 2017/0256865 A1* | 9/2017 | Sikes | H01Q 1/48 |
| 2018/0301817 A1 | 10/2018 | Ichinose | |
| 2018/0351261 A1 | 12/2018 | Kamo | |
| 2018/0358706 A1 | 12/2018 | Kildal | |

OTHER PUBLICATIONS

Written Opinion issued in PCT/SE2020/050103, dated Mar. 20, 2020, pp. 1-7.
Search Report issued in corresponding European Patent Application No. 20752323.4, dated Dec. 9, 2022, pp. 1-12.
Zaman Ashraf Uz et al: "Gap Waveguide PMC Packaging for Improved Isolation of Circuit Components in High-Frequency Microwave Modules", IEEE Transactions on Components, Packaging and Manufacturing Technology, IEEE, USA, vol. 4, No. 1, Jan. 1, 2014 (Jan. 1, 2014), pp. 16-25, XP011536233, ISSN: 2156-3950, DOI: 10.1109/TCPMT.2013.2271651.
Sanchez-Escuderos Daniel et al: "Dielectric Bed of Nails in Gap-Waveguide Technology at Millimeter-Wave Frequencies", IEEE Microwave and Wireless Components Letters, IEEE Service Center, New York, NY, US, vol. 24, No. 8, Aug. 1, 2014 (Aug. 1, 2014), pp. 515-517, XP011554832, ISSN: 1531-1309, DOI: 10.1109/LMWC.2014.2321496.
Li Yujian et al:"Low-Cost High-Gain and Broadband Substrate-Integrated-Waveguide-Fed Patch Antenna Array for 60-GHz Band", IEEE Transactions on Antennas and Propagation, IEEE, USA, vol. 62, No. 11, Nov. 1, 2014 (Nov. 1, 2014), pp. 5531-5538, XP011563028, ISSN: 0018-926X, DOI: 10.1109/TAP.2014.2350509.
Cao Jianyin et al: "W-Band High-Gain Circularly Polarized Aperture-Coupled Magneto-Electric Dipole Antenna Array With Gap Waveguide Feed Network", IEEE Antennas and Wireless Propagation Letters, vol. 16, May 3, 2017 (May 3, 2017),—May 3, 2017 (May 3, 2017), pp. 2155-2158, XP011657941, ISSN: 1536-1225, DOI: 10.1109/LAWP.2017.2700881.

* cited by examiner 501 translational symmetry:

Translation:

502 rotational symmetry:

503 glide symmetry:

504 irregular pattern:

ANTENNA ARRAY BASED ON ONE OR MORE METAMATERIAL STRUCTURES

TECHNICAL FIELD

The present disclosure relates to antenna arrays, particularly phased array antennas and beam steering antennas. The antenna array is suited for use in, e.g., telecommunication and radar transceivers.

BACKGROUND

Phased array antennas are frequently used in radar systems, e.g. in automotive radar applications, as well as in telecommunications. The design of antenna arrays is often hampered by the need to consider losses, for example in the form of electromagnetic radiation leaking from waveguides.

Antenna elements in a phased array antenna are by design often separated by a distance equal to or larger than half the wavelength of the electromagnetic radiation at the operational frequency. As a consequence, when the operational frequency increases, the antenna arrays can be made smaller due to the decreasing wavelength. This has a number of advantages, especially in applications where space is limited (e.g. automotive communication and sensor antennas). However, the reduced size also increases the risk of interaction between different array elements via, e.g., electromagnetic wave propagation along the antenna array. This risk must also be managed.

U.S. Pat. No. 8,803,638 B2 disclosed a waveguide arrangement where protruding posts were used to stop propagation of electromagnetic waves in undesirable directions.

However, there is still a need for an improved antenna array with reduced loss.

SUMMARY

It is an object of the disclosure to provide a compact, low-loss antenna array.

This object is obtained by an antenna array for operation in a frequency band. The antenna array has a layered structure comprising a base layer with a metamaterial structure, where the metamaterial structure is arranged to attenuate electromagnetic radiation propagating along said base layer in the frequency band. The antenna array also comprises a printed circuit board (PCB) layer, arranged on top of the base layer and comprising at least one radio frequency (RF) integrated circuit (IC) arranged on a side of the PCB facing the base layer. The PCB further comprises one or more feeds for transferring RF signals from the RF IC(s) to an opposite side of the PCB.

Additionally, the antenna array comprises a feed layer arranged on the opposite side of the PCB from the one or more RF IC(s). This feed layer comprises at least one waveguide arranged on the side of the feed layer facing away from the PCB, each such waveguide comprising a ridge along which electromagnetic waves are conducted, as well as comprising one or more metamaterial structures. The metamaterial structures are arranged to attenuate electromagnetic radiation propagating in other directions than along the waveguide in the frequency band. For instance, the metamaterial structures can be configured to attenuate propagation between adjacent waveguides, thereby alleviating leakage. The antenna array also comprises a radiating layer arranged on the feed layer, the radiating layer comprising a plurality of radiating elements for transmitting and/or receiving RF signals.

The described antenna array is compact, but still maintains low losses due to the presence of metamaterial structures that attenuate electromagnetic radiation propagating in unwanted directions. For example, the placement of the metamaterials in the feed layer minimizes interactions between adjacent waveguides, and thereby interactions between adjacent antenna elements. Such interactions can cause degradation of signal quality. Without the metamaterial structures, a larger spacing between waveguides would have been necessary to maintain signal quality.

Advantageously, there is no need for shielding elements other than the metamaterial structures, which simplifies design. Also, there is no need for advanced connectors, such as high precision coaxial cable connectors, which is an advantage.

According to aspects, the metamaterial structures in the antenna array may comprise at least two element types, the first type of element comprising an electrically conducting material and the second type of element comprising an electrically insulating material, the elements of the first type being interleaved with elements of the second type, with the physical dimensions of the elements of the first and second type being smaller than the wavelength of electromagnetic radiation in the frequency band, such that electromagnetic radiation in the frequency band is attenuated by the metamaterial structure.

This type of metamaterial has been observed to cause attenuation of electromagnetic radiation in a frequency band, also known as the electromagnetic band gap of the material, while simultaneously being compact and easy to manufacture.

There are different ways in which the metamaterial structure on, e.g., the feed layer can be realized, for instance.

According to some aspects, elements of the first type may comprise protruding features, and the elements of the second type are configured to occupy the space between the protruding features. The elements occupying the space between protruding features may comprise vacuum or air, a dielectric material such as Polytetrafluoroethylene (PTFE), or some other insulating material such as plastic or printed circuit board (PCB) material like FR-4 glass epoxy. The protruding features may comprise, e.g., posts of a conductive material, such as metal posts, metallized plastic or PTFE posts, or posts made of some conducting polymer material such as an intrinsically conducting polymer (ICP).

According to other aspects, elements of the first type may comprise an electrically conducting material comprising a plurality of cavities, and the elements of the second type are configured to at least partially occupy said cavities. Elements of the first and second type may be arranged in a pattern characterized by any of translational, rotational, or glide symmetry, or a periodic, quasi-periodic or irregular pattern. Again, the elements occupying the cavities may comprise vacuum or air, a dielectric material such as Polytetrafluoroethylene (PTFE), or some other insulating material such as a PCB material like FR-4 glass epoxy. The elements of the first type may be configured from an integrally formed element or as separate elements. The elements of the first type may comprise any of a metal element, a metallized plastic or PTFE element, and an element made of a conductive material, e.g., some conducting polymer material such as an intrinsically conducting polymer.

According to aspects, the antenna array also comprises a filter layer arranged between the PCB and the feed layer. Optionally, the filter layer comprises at least two waveguides arranged adjacent to each other. The waveguides in the filter layer may comprise one or more metamaterial structures, the metamaterial structures being arranged to attenuate electromagnetic radiation propagating between the at least two adjacent waveguides in the frequency band.

Advantageously, the metamaterial structures will lower the loss in the filter layer and impede interference between RF signals in adjacent waveguides.

According to aspects, the filter layer may be arranged to attenuate an interfering signal, or to reduce noise in the signal.

According to aspects, a radiating element of the radiating layer is a slot opening extending through the radiating layer, and preferably a rectangular slot opening.

According to aspects, a radiating element of the radiating layer is a bowtie antenna. Advantageously, bowtie antennas are easy to manufacture.

According to aspects, a radiating element of the radiating layer is a magneto-electric dipole antenna. Advantageously, magneto-electric dipole antennas are easy to manufacture and present low loss while presenting a wide bandwidth.

According to aspects, a feed on the PBC is a through hole connected to a corresponding opening in the feed layer or, if a filter layer is present, in the filter layer, the through holes of the PCB being fed by microstrip lines.

BRIEF DESCRIPTION OF THE DRAWINGS

The present disclosure will now be described more in detail with reference to the appended drawings, where.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

Figure 1:
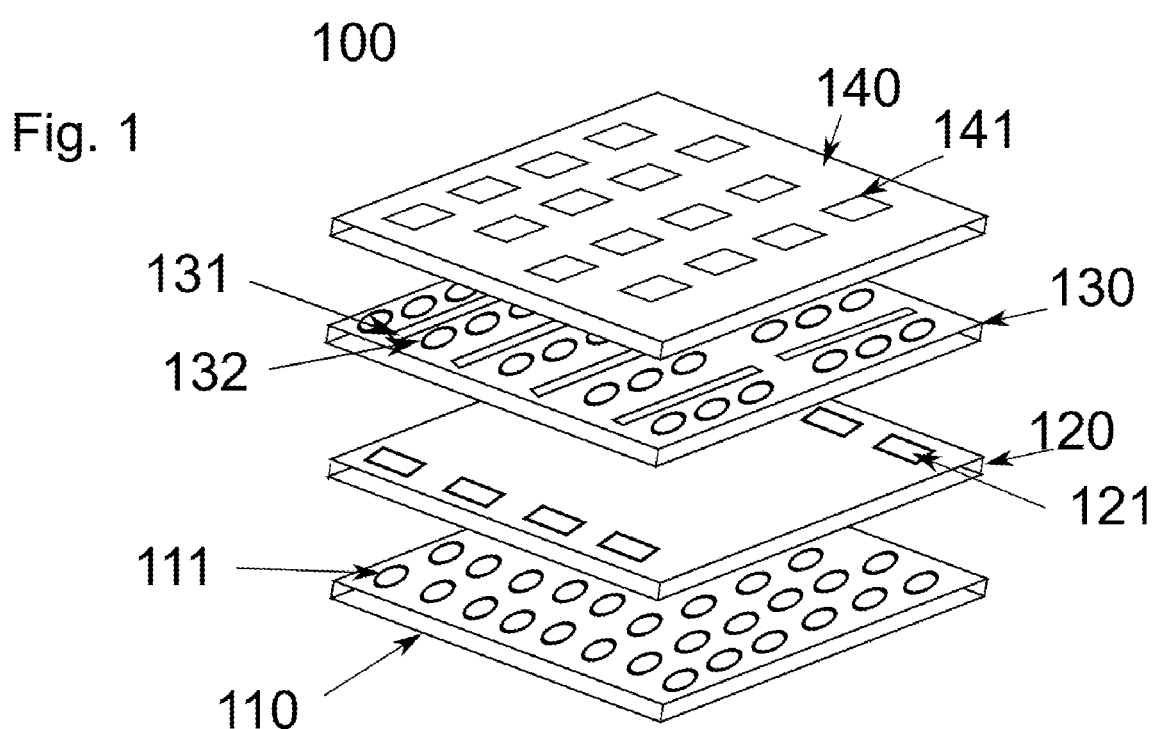
FIG. 1 is a drawing illustrating an antenna array according to the present disclosure.

FIG. 1 shows an antenna array 100 for transmitting and/or receiving radio frequency (RF) signals in a frequency band. A frequency band is an interval of frequencies between a lower cutoff frequency and a higher cutoff frequency. The antenna array has a layered structure.

A layered structure is a structure comprising a plurality of planar elements referred to as layers. Each element has two sides, or faces, and is associated with a thickness. The thickness is much smaller than the dimension of the faces, i.e., the layer is a flat element. According to some aspects, a layer is rectangular or square. However, more general shapes are also applicable, including circular or elliptical disc shapes.

The layered structure is stacked in the sense that layers are arranged on top of each other starting from a base layer. A second layer arranged on top of a first layer is located further away from the base layer than the first layer. In other words, the layered structure is a sandwich structure built from a base layer in a direction.

The layered structure 100 shown in FIG. 1 comprises a base layer 110. The base layer here comprises a metamaterial structure 111 arranged to attenuate electromagnetic radiation in the frequency band propagating along the base layer. Herein, to attenuate is interpreted as to significantly reduce an amplitude or power of electromagnetic radiation, such as a radio frequency signal. The attenuation is preferably complete, in which case attenuate and block are equivalent, but it is appreciated that such complete attenuation is not always possible to achieve. In any case, the metamaterial structure is arranged to minimize energy losses occurring through the propagation of electromagnetic radiation along the base layer.

A metamaterial that attenuates electromagnetic radiation in a frequency band is known more generally as an electromagnetic bandgap material (EBM). There exists a multitude of EBM varieties. In general, an EBM comprises elements of different types consisting of materials with contrasting dielectric properties. Here, contrasting dielectric properties is interpreted to mean that the difference in dielectric properties between the materials is large enough for diffraction of the electromagnetic waves in a given frequency band to occur. According to one example, an EBM may consist of two materials, of which the first has dielectric properties similar to those of air and the second material has dielectric properties similar to those of silica glass. In other words, the first material has a refractive index near 1 and the second material has a refractive index near 1.5.

Figure 5:
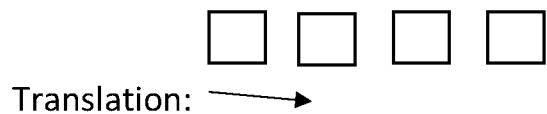
FIG. 5 is a drawing illustrating four types of metamaterial element arrangements.
Figure 5:
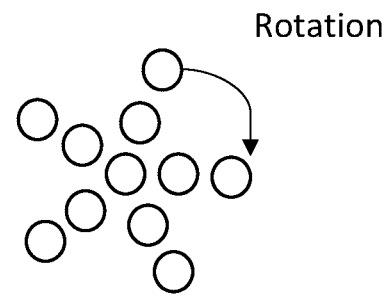
Figure 5:
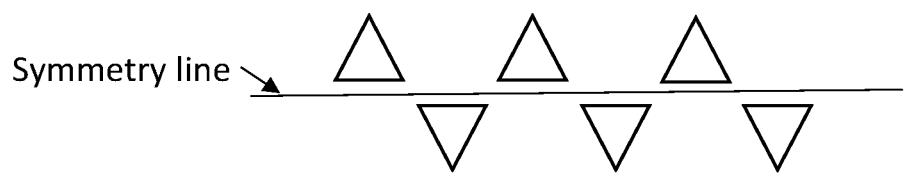
Figure 5:
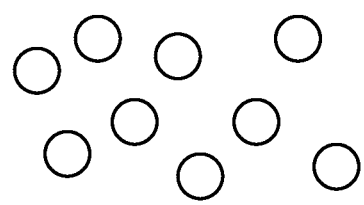

The elements of the EBM are arranged in a periodic or quasi-periodic pattern in one, two or three dimensions, as will be discussed in more detail below in connection to FIG. 5.

Herein, a quasi-periodic pattern is interpreted to mean a pattern that is locally periodic but displays no long-range order. A quasi-periodic pattern may be realized in one, two or three dimensions. As an example, a quasi-periodic pattern can be periodic at length scales below ten times the element spacing, but not at length scales over 100 times the element spacing. As another example, a quasi-periodic pattern can be a Penrose tiling, which constitutes an example of non-periodic tiling generated by an aperiodic set of prototiles. The aperiodicity of prototiles implies that a shifted copy of a tiling will never match the original. A Penrose tiling may be constructed so as to exhibit both reflection symmetry and fivefold rotational symmetry. A Penrose tiling is non-periodic, which means that it lacks any translational symmetry. It is self-similar, so the same patterns occur at larger and larger scales. Thus, the tiling can be obtained through "inflation" (or "deflation") and every finite patch from the tiling occurs infinitely many times. It is a quasicrystal: implemented as a physical structure a Penrose tiling will produce Bragg diffraction and its diffractogram reveals both the fivefold symmetry and the underlying long range order.

The elements in the EBM have a size parameter that determines at which frequencies radiation is attenuated. As an example, if an element is a slab, i.e., a rectangular box-like element the size parameter is the thickness of the slab. As another example, if an element is a rod with a circular cross-section, the size parameter is the diameter of the circular cross-section. For a suitable electromagnetic bandgap to be achieved, the size parameter must be close to the wavelength in air of the electromagnetic radiation in the frequency band, divided by two. As an example, defining center frequency as the frequency in the middle of the frequency band, the size of the elements can be the wavelength of radiation at the center frequency divided by two, multiplied by a factor between 0.9 and 1.1. This type of EBM is also known as a photonic crystal.

According to another example, an EBM may comprise at least two element types, the first type of element comprising an electrically conducting material and the second type of element comprising an electrically insulating material. Elements of the first type may be made from a metal such as copper or aluminum, or from a non-conducting material like PTFE or FR-4 coated with a thin layer of a conducting material like gold or copper. Elements of the first type may also be made from a material with an electric conductivity comparable to that of a metal, such as a carbon nanostructure or conducting polymer. As an example, the electric conductivity of elements of the first type can be above $10^3$ Siemens per meter (S/m). Preferably, the electric conductivity of elements of the first type is above $10^5$ S/m. In other words, the electric conductivity of elements of the first type is high enough that the electromagnetic radiation can induce currents in the elements, and the electric conductivity of elements of the second type is low enough that no currents can be induced in elements of the second type.

Elements of the second type may optionally be non-conducting polymers, vacuum, or air. Examples of such non-conducting element types also comprise FR-4 PCB material, PTFE, plastic, rubber, and silicon.

The physical properties of the elements of the second type also determines the dimensions required to obtain attenuation of electromagnetic propagation past the EBM. Thus, if the second type of material is chosen to be differently from air, the required dimensions of the first type of element changes. Consequently, a reduced size antenna array can be obtained by varying the choice of material for the first and the second type of element. Advantageously, a reduced size antenna array may be obtained from such a choice.

According to a first example, elements of the first type are arranged in a periodic pattern with some spacing. The spaces between the elements of the first type constitute the elements of the second type. In other words, the elements of the first type are interleaved with elements of the second type. Interleaving of the elements of the first and second type can be achieved in one, two or three dimensions.

A size of the elements of either the first or the second type, or both, is smaller than the wavelength in air of electromagnetic radiation in the frequency band. As an example, defining the center frequency as the frequency in the middle of the frequency band, the element size is between $\frac{1}{10}$th and $\frac{1}{50}$th of the wavelength in air of electromagnetic radiation at the center frequency. A metamaterial of this type is also known as an artificial magnetic conductor (AMC).

Here, the element size is interpreted as the size of an element in a direction in which radiation propagates. As an example, for an element comprising a vertical rod with a circular cross-section and with electromagnetic radiation propagating in the horizontal plane, the size of the element is a length of the cross-section of the rod.

Figure 2:
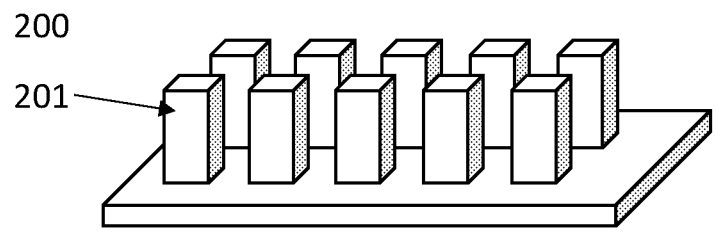
FIG. 2 is a drawing illustrating a metamaterial structure.
Figure 3:
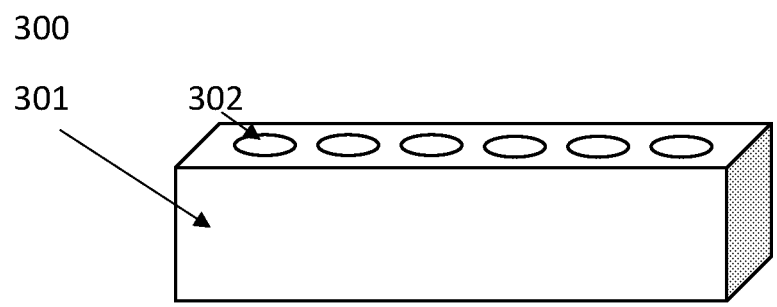
FIG. 3 is a drawing illustrating another metamaterial structure.
Figure 4:
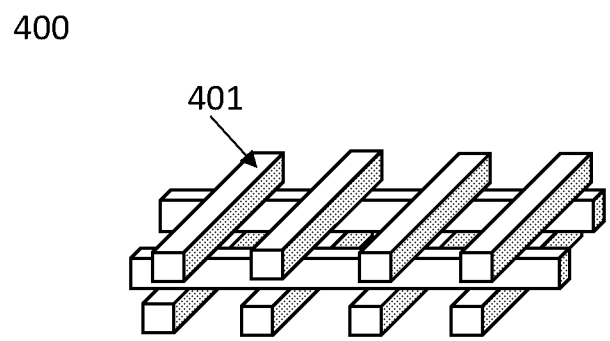
FIG. 4 is a drawing illustrating a third metamaterial structure.

FIGS. 2, 3 and 4 show examples of how elements of the first and second type may be arranged in an AMC. A type of AMC 200 shown in FIG. 2 comprises electrically conductive protrusions 201 on a conducting substrate. The protrusions 201 may optionally be encased in a dielectric material. In the example of FIG. 2, the electrically conductive protrusions constitute the elements of the first type, and the spaces in-between the protrusions, optionally filled with a non-conducting material, constitute the elements of the second type. It is appreciated that the protrusions 201 may be formed in different shapes. FIG. 2 shows an example where the protrusions have a square cross-section, but the protrusions may also be formed with a circular, elliptical, rectangular, or more generally shaped cross-section shape.

As another example, a type of AMC 300 shown in FIG. 3 consists of a single slab of conducting material 301 into which cavities 302 have been introduced. The cavities may be air-filled or filled with a non-conducting material. It is appreciated that the cavities may be formed in different shapes. FIG. 3 shows an example where elliptical cross-section holes have been formed, but the holes may also be formed with circular, rectangular, or more general cross-section shapes. In the example of FIG. 3, the slab 301 constitutes the elements of the first type, and the holes 302 constitute the elements of the second type.

FIG. 4 schematically illustrates a third exemplary type of AMC 400 consisting of extended electrically conducting elements 401, optionally rods or slabs, stacked in multiple layers with the rods in a layer arranged at an angle to the rods in a previous layer. In the example of FIG. 4, the rods constitute elements of the first type and the spaces in between constitutes elements of the second type. The example of FIG. 4 shows an AMC where interleaving of elements of the first and second type is achieved in three dimensions.

With reference again to FIG. 1, the antenna array 100 further comprises a printed circuit board (PCB) layer 120 arranged on top of the base layer 110, i.e., having a face arranged on the base layer, and comprising at least one RF integrated circuit (IC) arranged on a side of the PCB facing the base layer. The PCB further comprises one or more feeds 121 for transferring RF signals from the RF IC(s) to an opposite side of the PCB.

According to an example, the feeds 121 on the PCB layer 120 are through holes connected to a corresponding opening in a feed layer 130 arranged on top of the PCB layer 120, the through holes of the PCB layer 120 being fed by microstrip lines.

The antenna array also comprises a feed layer 130 arranged on the opposite side of the PCB from the RF IC(s), the feed layer comprising at least one waveguide arranged on the side of the feed layer facing away from the PCB. Each waveguide comprises a ridge 131 along which electromagnetic waves are conducted, as well as one or more metamaterial structures 132. The metamaterial structures are arranged to attenuate electromagnetic radiation propagating in other directions than along the waveguide in the frequency band. The metamaterial structures are EBMs, such as the ones described above.

Advantageously, use of EBMs in the feed layer lowers losses from the waveguides as well as interference between RF signals in adjacent waveguides. A consequence of this is that a higher signal to noise ratio can be maintained due to the use and placement of EBMs in the feed layer. More advantageously, if the feed layer comprises waveguides with one or more metamaterial structures, a highly efficient coupling can be formed at the transitions from the feeds 121 on the PCB layer 120 to the waveguides, which results in low loss. Even more advantageously, the highly efficient coupling from the feeds 121 to the waveguides avoids the use of a quarter wavelength short at the slot opening, thereby allowing a more compact design.

The antenna array further comprises a radiating layer 140 arranged on top of the feed layer, the radiating layer comprising a plurality of radiating elements 141 for transmitting and/or receiving RF signals.

As an example, a radiating element 141 of the radiating layer 140 may be a slot opening extending through the radiating layer. The slot opening is preferably rectangular, although other shapes such as square, round, or more general shapes are also possible. The slot openings are preferably small compared to the size of the radiating layer 140 and arranged in parallel lines on the radiating layer 140, although other arrangements are possible. According to one example, the size of the slot openings is such that eight to ten slot openings can be arranged in a line on the radiating layer 140. According to another example, a single large slot opening that extends over most of the radiating layer is used.

As another example, a radiating element of the radiating layer may be a bowtie antenna. As a third example, a radiating element of the radiating layer may be a patch antenna. Advantageously, both bowtie and patch antennas are easy to manufacture.

Figure 7A:
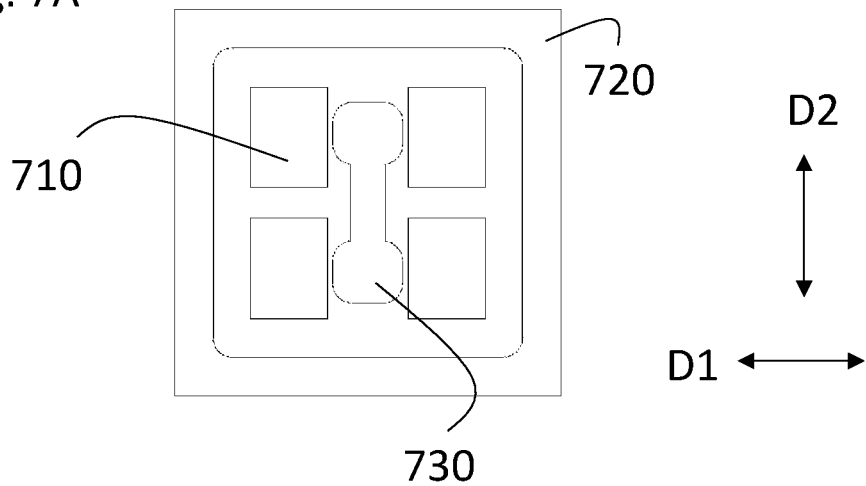
FIGS. 7A, 7B, and 7C illustrate different angles of an example magneto-electric dipole antenna.
Figure 7B:
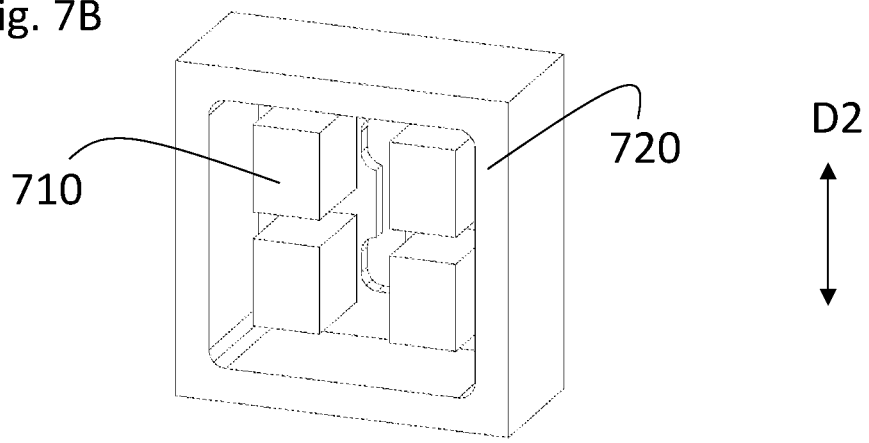
Figure 7C:
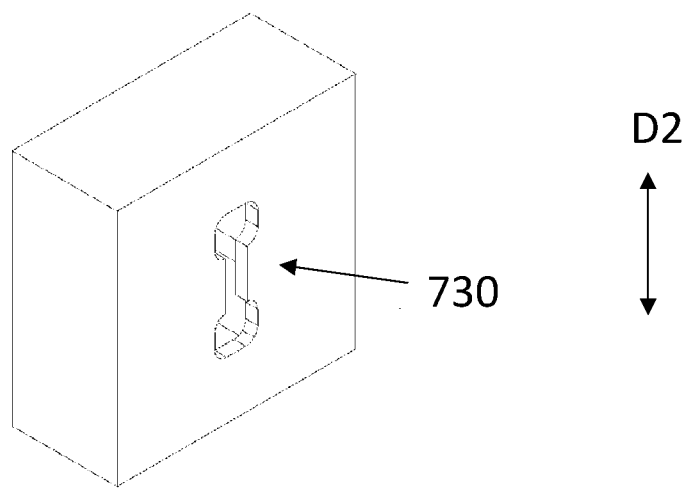

Another example of a radiating element is a magneto-electric (ME) dipole antenna, see FIGS. 7A, 7B, and 7C. An ME dipole is based on the principle of combining two fundamental radiating elements: an electric dipole antenna and an equivalent magnetic dipole antenna. The ME-dipole may be realized using four electrically conductive pins surrounded by an electrically conductive cavity, where the pins are arranged on a conductive surface with a slot opening. Such ME dipole antenna can be easily fabricated using, e.g., conventional milling technology. Furthermore, the cavity-based ME dipole antenna presents low loss while presenting a wide bandwidth.

During radiation, electromagnetic energy coming from the feed layer 130 is coupled to the radiating element through a slot 730. In the example of FIGS. 7A, 7B, and 7C, the slot has the shape of a capital "I" in a serif typeface, i.e. a dumbbell shape. It is realized that other shapes are also possible, such as rectangular, in the shape of a bowtie, or staircase shaped. The slot extends in a direction D2 and has a length in the extension direction corresponding to half a wavelength of the of the electromagnetic radiation at the operational frequency. The slot 730 is employed to maximize the energy coupled into the radiating element from the feed layer 130 across a wide bandwidth over the limited spacing.

Figure 8A:
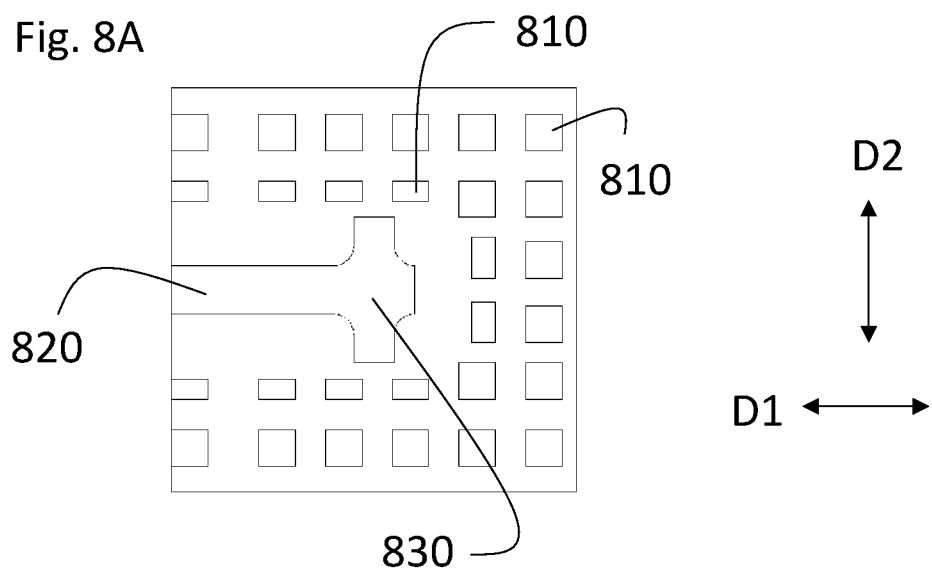
FIGS. 8A, 8B, and 8C illustrate different angles of a portion of an example feed layer for a magneto-electric dipole antenna.
Figure 8B:
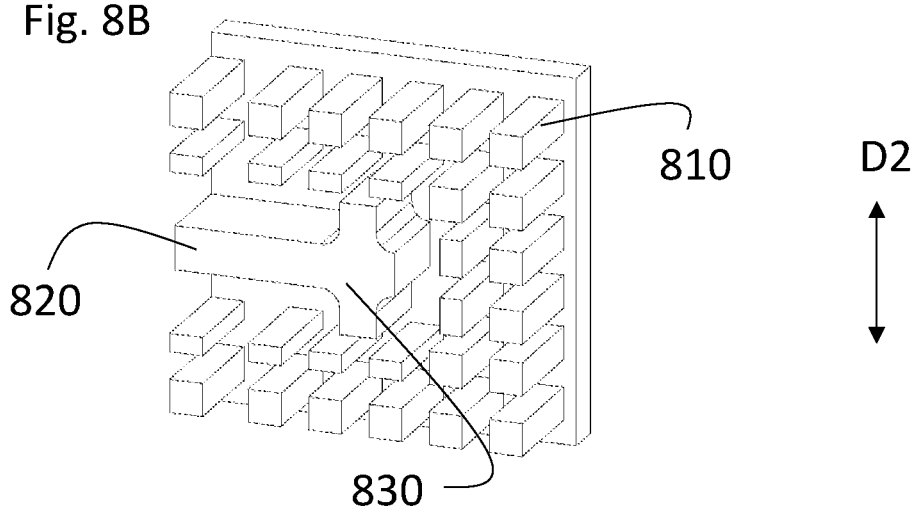
Figure 8C:
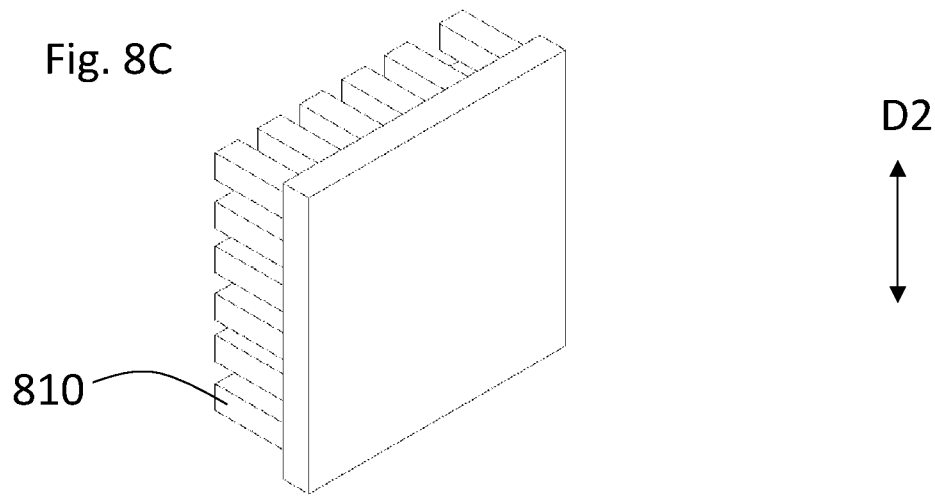

FIGS. 8A, 8B, and 8C show different angles of a portion of an example feed layer 130 for the ME dipole antenna example in FIGS. 7A, 7B, and 7C. The example feed layer portion comprises protruding pins 810, similar to the protrusions 201 in FIG. 2. The figure also shows a waveguide ridge 820, which shape 830 in connection to the slot is arranged to match the shape of the slot 730. This matching is employed to maximize the energy coupled into the radiating element from the feed layer 130 across a wide bandwidth over the limited spacing. The protruding pins 810 are just one example of a possible metamaterial structure in the feed layer; many other metamaterial structures are possible, as mentioned earlier in this document.

Figure 9A:
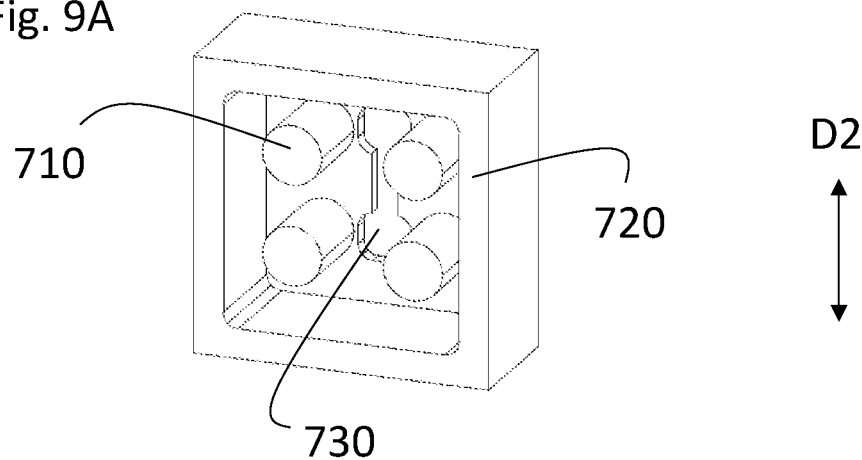
FIGS. 9A and 9B illustrate different example magneto-electric dipole antennas.
Figure 9B:
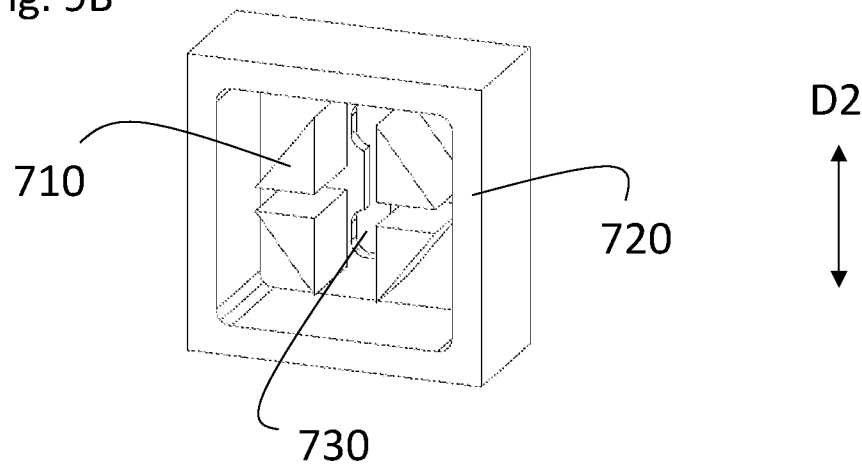
Figure 10:
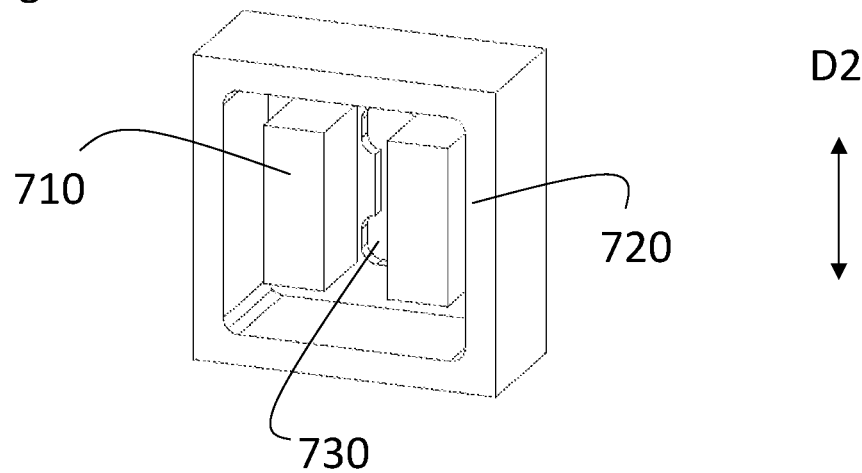
FIG. 10 illustrates an example magneto-electric dipole antenna.

The ME-dipole antenna in FIGS. 7A, 7B, and 7C is realized by the four conductive pins 710 and the cavity walls 720 surrounding them. The pins have a length, extending from the conductive surface, corresponding to a quarter of the wavelength of the of the electromagnetic radiation at the operational frequency. In FIG. 7A, the four pins have a rectangular cross-sectional shape, where the longer sides of the rectangle extend in a direction D2 and the shorter sides extend in a direction D1. A first pair of pins comprise two pins on different sides of the slot wherein the extension direction of the shorter sides of the rectangle coincide. A second pair of pins comprise the remaining two pins. The surfaces of the two pairs of pins function as two respective electric dipoles along the direction D1. Three equivalent magnetic dipoles are accomplished by the gaps between the conductive pins and the cavity wall along the direction D2 and the gap between the four pins in the direction D2. Note that other shapes of the cross section of the pins are also possible, such as circular (see FIG. 9A), elliptical, triangular (see FIG. 9B), or more general shapes. Also note that it is possible to have any even number of pins in the ME dipole antenna, i.e. pairs of pins with pins on respective sides of the slot, see FIG. 10 for an example of a single pair of pins.

Figure 11A:
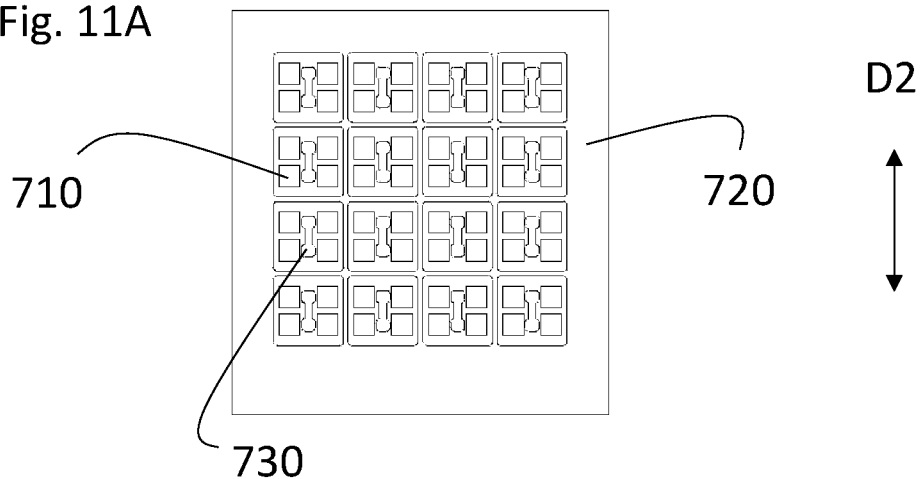
FIGS. 11A, 11B, and 11C illustrate different angles of an example array of magneto-electric dipole antennas.
Figure 11B:
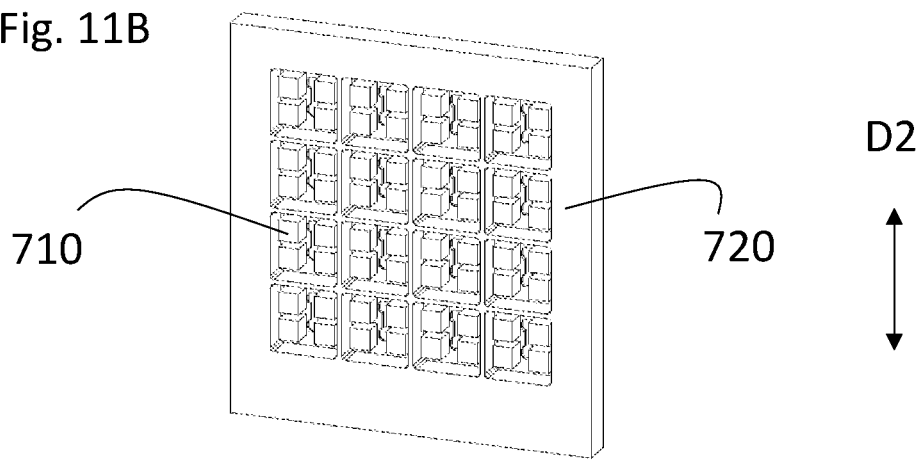
Figure 11C:
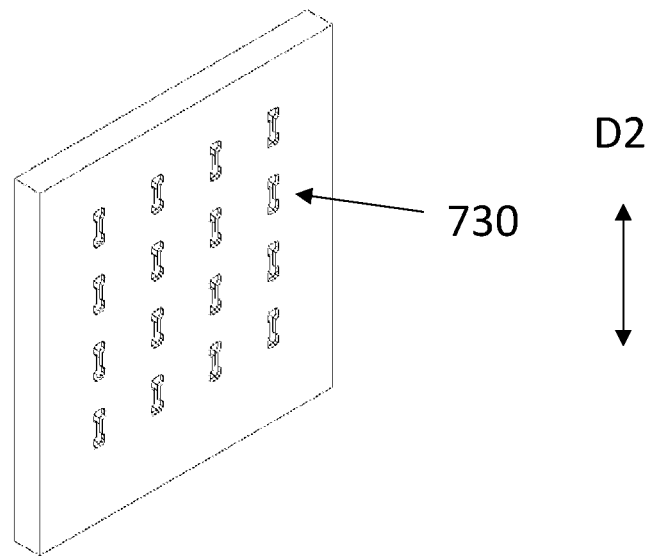

Preferably, adjacent ME-dipole antennas in the radiating layer should have a spacing of less than half a wavelength of the of the electromagnetic radiation at the operational frequency to avoid grating lobes. FIGS. 11A, 11B, and 11C show different angles of an example array of the ME dipole antenna, which may constitute the radiating layer 140.

To summarize, FIG. 1 shows an antenna array 100 configured for operation in a frequency band, the antenna array having a layered configuration comprising a base layer 110 with a metamaterial structure arranged to attenuate electromagnetic radiation propagating along said base layer in the frequency band, where the metamaterial structure does not comprise a plurality of protruding posts. The antenna array 100 also comprising a PCB layer 120, arranged on top of the base layer 110 and comprising at least one radio frequency (RF) integrated circuit (IC) arranged on a side of the PCB layer 120 facing the base layer 110. The PCB layer 120 further comprising one or more feeds 121 for transferring RF signals from the RF IC(s) to an opposite side of the PCB layer 120.

The antenna array further comprises at least one feed layer 130 arranged on the opposite side of the PCB layer 120 from the RF IC(s), the feed layer comprising at least one waveguide arranged on the side of the feed layer facing away from the PCB layer 120. Each waveguide comprising a ridge 131 along which electromagnetic waves are conducted, as well as one or more metamaterial structures 132, the metamaterial structures being arranged to attenuate electromagnetic radiation propagating in other directions than along the waveguide in the frequency band. The metamaterial structure does not comprise a plurality of protruding posts.

In other words, there is disclosed herein an antenna array comprising a metamaterial structure characterized in that the metamaterial structure(s) comprises EBMs arranged to attenuate electromagnetic radiation in the frequency band propagating in other directions than along the waveguide, wherein the EBM comprises elements of a type other than protruding posts.

The antenna array also comprises a radiating layer 140 arranged on the at least one feed layer 130, the radiating layer comprising a plurality of radiating elements 141 for transmitting and/or receiving RF signals.

Figure 6:
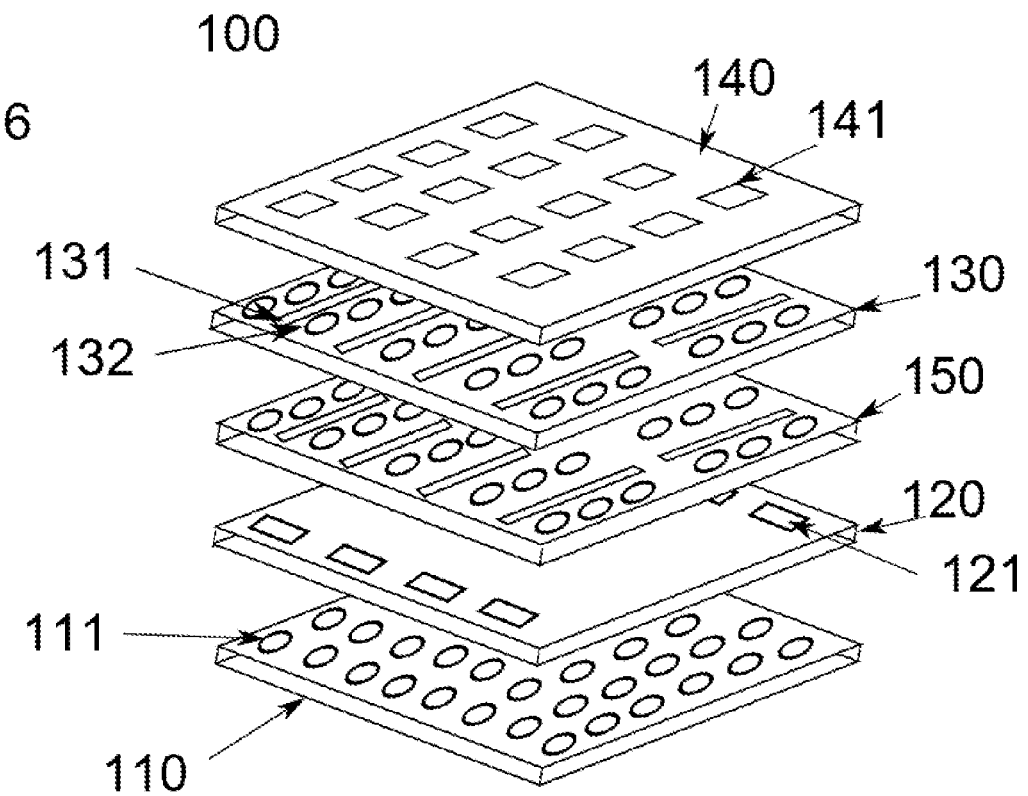
FIG. 6 is a drawing illustrating an antenna array with a filter layer according to the present disclosure.

With reference to FIG. 6, the antenna array 100 may also comprise a filter layer 150 arranged between the PCB layer 120 and the feed layer 130. The filter layer 150 is arranged to filter a RF signal. According to one example, the filter layer 150 is arranged to transmit only signal components above a cutoff frequency and filter out signal components below the cutoff frequency. According to another example, the filter layer 150 is arranged to transmit only signal components higher than a lower cutoff frequency and lower than a higher cutoff frequency.

The filter layer 150 comprises at least one waveguide. The waveguides in the filter layer may comprise one or more metamaterial structures, the metamaterial structure(s) comprising EBMs arranged to attenuate electromagnetic radiation in the frequency band propagating in other directions than along the waveguide. Advantageously, incorporating one or more metamaterial structures into the waveguides of the filter layer will lower the loss compared to conventional waveguides, as well as preventing interference between adjacent waveguides.

Overall, the layered structure provides an efficient means for transmission and reception of high frequency electromagnetic signals, such as radio frequency signals at E-band around 80 GHz.

Signals for transmission are generated by the RF IC(s) arranged on one side of the PCB layer 120. The signal is conducted to the feeds 121. The meta material structure 111 on the base layer 110 reduces loss during this step. Via the feeds 121 the signal passes to the feed layer 130, where it follows a ridge 131. The metamaterial structures 132 reduce losses and interactions between signals in adjacent waveguides during this step. The signal is then transmitted via radiating elements 141 in the radiating layer 140.

Optionally, if a filter layer 150 is included, the signal passes from the feeds 121 to the filter layer 150, where the signal is filtered. Subsequently, the signal is conducted to the feed layer 130 and transmitted via radiating elements in the radiating layer 140.

Received signals enter via the radiating elements in the radiating layer 140. The signals enter the waveguides of the feed layer and are conducted to the feeds 121 in the PCB layer 120. From the feeds the signals are conducted to the RF IC(s). Alternatively, if a filter layer 150 is included, the signal is filtered by the filter layer 150 before entering the PCB layer 120.

The invention claimed is:

1. An antenna array for operation in a frequency band, the antenna array having a layered configuration comprising:
    a base layer with a metamaterial structure, the metamaterial structure being arranged to attenuate electromagnetic radiation propagating along said base layer in the frequency band;
    a printed circuit board (PCB) layer, arranged on top of the base layer and comprising at least one radio frequency (RF) integrated circuit (IC) arranged on a side of the PCB layer facing the base layer, the PCB layer further comprising one or more feeds for transferring RF signals from the RF IC(s) to an opposite side of the PCB layer;
    at least one feed layer arranged on the opposite side of the PCB layer from the RF IC(s), the feed layer comprising at least one waveguide on the side of the feed layer facing away from the PCB layer, each waveguide comprising a ridge along which electromagnetic waves are conducted, each waveguide further comprising one or more metamaterial structures, the metamaterial structures being arranged to attenuate electromagnetic radiation propagating in directions other than along the waveguide in the frequency band; and
    a radiating layer arranged on the at least one feed layer, the radiating layer comprising a plurality of radiating elements for transmitting and/or receiving RF signals.

2. The antenna array according to claim 1, wherein at least one of the metamaterial structures comprise at least two element types, the first element type comprising an electrically conducting material and the second element type comprising an electrically insulating material, the elements of the first type being interleaved with the elements of the second type, wherein a physical dimension of the elements of the first and of the second type is smaller than a wavelength of electromagnetic radiation in the frequency band, such that electromagnetic radiation in the frequency band is attenuated by the metamaterial structure.

3. The antenna array according to claim 2, wherein the elements of the first type comprise protruding features, and the elements of the second type occupy the space between the protruding features.

4. The antenna array according to 3, wherein the elements of the first and second type are arranged in a pattern characterized by translational, rotational, or glide symmetry, or a quasi-periodic pattern.

5. The antenna array according to claim 2, wherein the elements of the first type comprise an electrically conducting material comprising a plurality of cavities, and wherein the elements of the second type occupy said cavities.

6. The antenna array according to 5, wherein the elements of the first and second type are arranged in a pattern characterized by translational, rotational, or glide symmetry, or a quasi-periodic pattern.

7. The antenna array according to 2, wherein the elements of the first and second type are arranged in a pattern characterized by translational, rotational, or glide symmetry, or a quasi-periodic pattern.

8. The antenna array according to claim 1, wherein at least one of the metamaterial structures comprises a periodic or quasi-periodic arrangement of materials with contrasting dielectric properties.

9. The antenna array according to claim 1, wherein the antenna array comprises a filter layer arranged between the PCB and the feed layer.

10. The antenna array according to claim 9, wherein the waveguides in the filter layer comprise one or more metamaterial structures, the metamaterial structures being arranged to attenuate electromagnetic radiation propagating between the at least two adjacent waveguides in the frequency band.

11. The antenna array according to claim 1, wherein a feed on the PBC layer is a through hole connected to a corresponding opening in the feed layer or, if a filter layer is present, in the filter layer, the through holes of the PCB being fed by microstrip lines.

12. The antenna array according to claim 1, wherein at least one of the radiating elements is a slot opening extending through the radiating layer.

13. The antenna array according to claim 1, wherein at least one of the radiating elements is a is a bowtie antenna.

14. The antenna array according to claim 1, wherein at least one of the radiating elements is a is a patch antenna.

15. The antenna array according to claim 1, wherein at least one of the radiating elements is a is a magneto electric dipole antenna.

16. A transceiver for radar and/or communications applications comprising an antenna array according to claim 1.

* * * * *